United States Patent [19]
Henrich et al.

[11] Patent Number: 6,123,494
[45] Date of Patent: *Sep. 26, 2000

[54] PROCESS FOR THE LOADING AND UNLOADING OF AN EVACUATABLE TREATMENT CHAMBER AND HANDLING DEVICE FOR CARRYING OUT THE PROCESS

[75] Inventors: Jürgen Henrich, Limeshain; Gerd Ickes, Hainburg, both of Germany

[73] Assignee: Leybold Systems GmbH, Hanau, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 09/057,973

[22] Filed: Apr. 10, 1998

[30] Foreign Application Priority Data

Apr. 11, 1997 [DE] Germany .............................. 197 15 151
Apr. 11, 1997 [DE] Germany .............................. 297 06 556

[51] Int. Cl.[7] .................................................... B65D 49/07
[52] U.S. Cl. .......................... 414/217; 414/805; 414/939
[58] Field of Search ...................................... 414/217, 939, 414/805

[56] References Cited

U.S. PATENT DOCUMENTS

| | | | |
|---|---|---|---|
| 3,874,525 | 4/1975 | Hassan et al. | 214/17 B |
| 3,968,885 | 7/1976 | Hassan et al. | 214/1 |
| 4,524,719 | 6/1985 | Campbell et al. | 414/217 |
| 4,699,554 | 10/1987 | Kawashima et al. | 414/217 |
| 5,364,219 | 11/1994 | Takahashi et al. | 414/217 |
| 5,447,409 | 9/1995 | Grunes et al. | 414/939 |
| 5,586,585 | 12/1996 | Bonora et al. | 414/217 |
| 5,590,994 | 1/1997 | Schertler | 414/217 |
| 5,730,573 | 3/1998 | Masujima et al. | 414/217 |
| 5,752,796 | 5/1998 | Muka | 414/217 |
| 5,759,268 | 6/1998 | Begin et al. | 414/217 |
| 5,837,059 | 11/1998 | Glants | 414/217 |
| 5,857,826 | 1/1999 | Sato et al. | 414/217 |

FOREIGN PATENT DOCUMENTS

| | | |
|---|---|---|
| 4116554A1 | 4/1992 | Germany . |
| 4117969A1 | 12/1992 | Germany . |
| 4235676A1 | 6/1994 | Germany . |
| 2143494A | 2/1985 | United Kingdom . |
| 9626847A1 | of 0000 | WIPO . |

OTHER PUBLICATIONS

JP 5–279852 A. Patent Abstracts of Japan, C–1161, Feb. 4, 1994, vol. 18, No. 68.

*Primary Examiner*—Steven A. Bratlie
*Attorney, Agent, or Firm*—Smith, Gambrell & Russell, LLP

[57] ABSTRACT

A processing station arranged in a vacuum chamber (2) for the coating of workpieces by a device, which loads or empties the workpieces through at least one opening set in the chamber wall (3,3',3") of the vacuum chamber(2) which can be closed off with a cover (14,14'). The loading/unloading device includes a vertically oriented shaft (42), on which a pusher part (26,26') is affixed, which primarily is movable by a lever mechanism through a push/pull connecting rod (40,40'). A gripping device (10,10';11'11') is arranged on the pusher part (26,26') for the transport of the workpieces. Through rotation of the shaft (42), the push/pull connecting rod (40,40') is radially moved between an open position ($P_2$) of the cover (14,14') near the axle and a closed position ($P_1$) of the cover (14,14') away from the axle. In the closed position ($P_2$) of the cover, the gripping device projects completely into the vacuum chamber (2). For the loading of the vacuum chamber (2) with work pieces (8,8'), the pusher part (26,26') is next loaded with the workpieces (8) to be processed. Through subsequent rotation of the loaded pusher part (26,26') about the shaft (42), the pusher part (26,26') is brought in front of the opening (24) of the vacuum chamber (2). Next, the pusher part (26,26') is moved toward the opening by rotation of the shaft (42) in a radial direction, and is closed vacuum tight with the cover (14,14') connected to the pusher part (26,26').

9 Claims, 5 Drawing Sheets

PROCESS FOR THE LOADING AND UNLOADING OF AN EVACUATABLE TREATMENT CHAMBER AND HANDLING DEVICE FOR CARRYING OUT THE PROCESS

INTRODUCTION AND BACKGROUND

The present invention relates to a loading and unloading device for an evacuatable chamber and a process for the loading and unloading of such a treatment chamber.

Loading and unloading devices of this general type are used to feed work pieces to be processed, for example, machined parts to be coated, or to remove the coated machined pieces from the coating apparatus. For this purpose, coating apparatuses of this type have an in-/out-transport station into or out of which the workpieces are transportable. The in-or out- transport process itself requires that the transport station is to be evacuated for the aeration, or for the processing of the workpiece in the vacuum chamber.

In the operation of the known generic type loading/unloading devices (handling devices), for the unloading of the previously aerated transport station, first the transport station door is opened by a traverse drive, after which a handling arm travels into the transport station and grasps a carrying base bearing the machined pieces. This first handling arm then travels out of the transport station far enough that a second handling arm with a carrying base bearing an uncoated machined piece can be processed. After that, the second handling arm transfers the carrying base to a retaining device in the transport station. Subsequent to this transfer, the second handling arm is withdrawn from the transport station and the latter is closed with the transverse drive transport station door. Afterwards, the workpieces introduced into the vacuum chamber are transferred to a processing station within the vacuum chamber.

A disadvantage of this known loading/unloading device is, that the amount of time for the loading or the unloading from the transport station in proportion to the entire processing time required for the coating process is great. Especially with so-called short time coating apparatuses it is desirable to keep the cycle time, that is the overall time elapsed between two sending cycles, as small as possible.

SUMMARY OF THE INVENTION

An object of the invention is to overcome the problem of supplying a loading/unloading device of the type described so that the cycle time of the coating process to be performed in a vacuum apparatus can be kept to a minimum with the application of a simple method.

The above and other objects of the invention are achieved by a device for the loading and unloading of a processing station with workpieces to be processed comprising:

a vacuum chamber for receiving a workpiece in or transporting a workpiece out through at least one opening set into said chamber wall of the vacuum chamber which can be shut off with a cover, at least one pusher part which can be rotated about a turning axle that does not spin in relation to the opening, which pusher part has a lever mechanism that in particular consists of a push/pull connecting rod, linked on one end to said cover and on the other end to an arm affixed to said turning axle, which pusher part is radially movable in relation to the axle and whereby, at least one gripping device is arranged on the pusher part on the cover, for the reception and for the transport of the workpiece, and whereby, through rotation of the axle, the push/pull connecting rod with its ends linked to the cover, is radially movable in relation to the axle between an open position of the cover near the axle which is open in relation to the opening and a closed position distant from the axle which is closed in relation to the opening, whereby the gripping device is arranged on the cover, such that it completely projects into the vacuum chamber in the closed position.

A further feature of the invention is a process for loading/unloading of a vacuum chamber, with which, under application of the means according to the invention, the loading and/or unloading time into/from a vacuum chamber with this workpiece to be processed is minimized.

BRIEF DESCRIPTION OF DRAWINGS

The present invention will be further understood with reference to the accompanying drawings, relating to the particularly preferred embodiments, wherein.

DETAILED DESCRIPTION OF INVENTION

Figure 1:
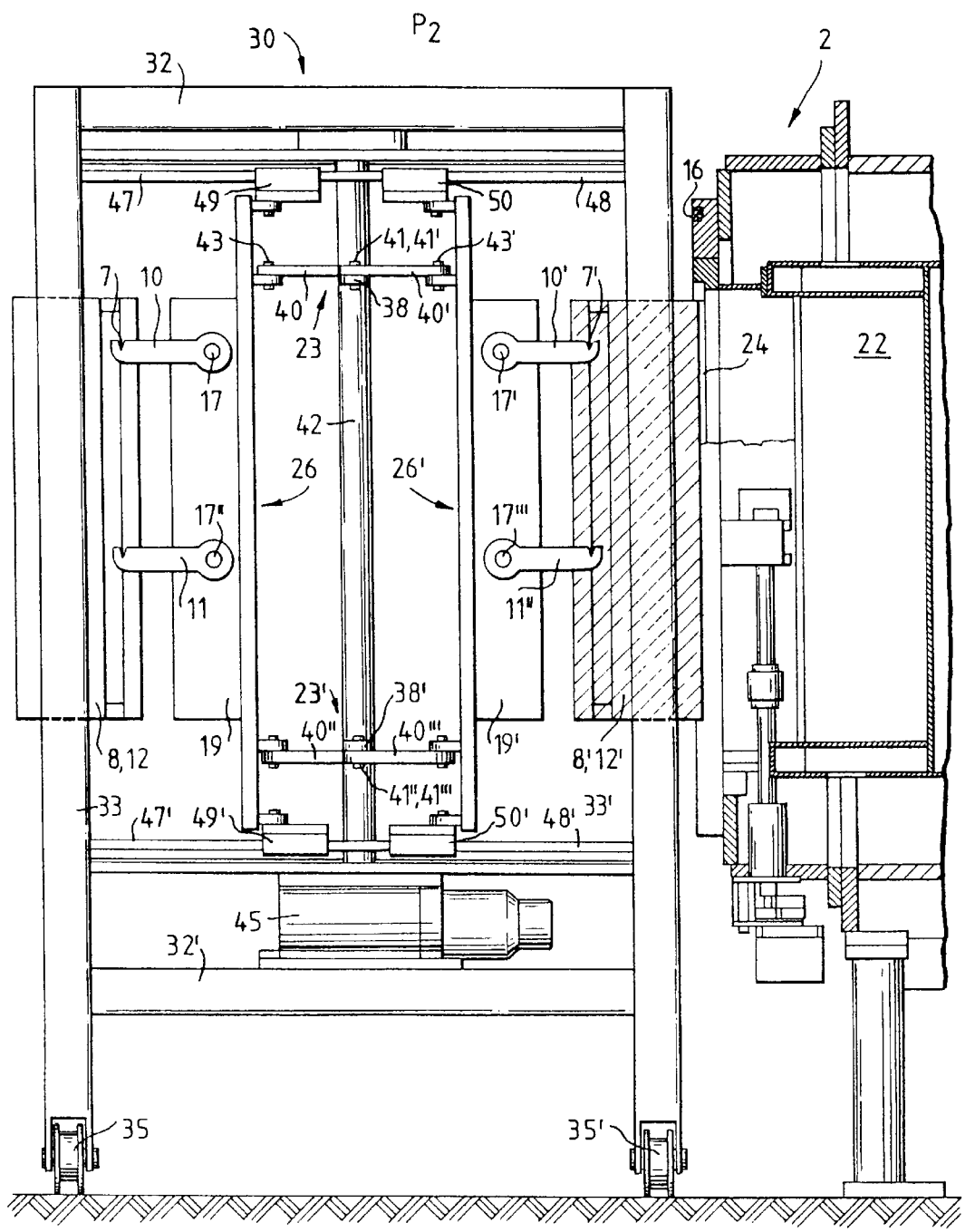
FIG. 1 is a schematic elevational side view of a loading/unloading device and a vacuum chamber arranged with workpieces to be coated in accordance with the invention.
Figure 2:
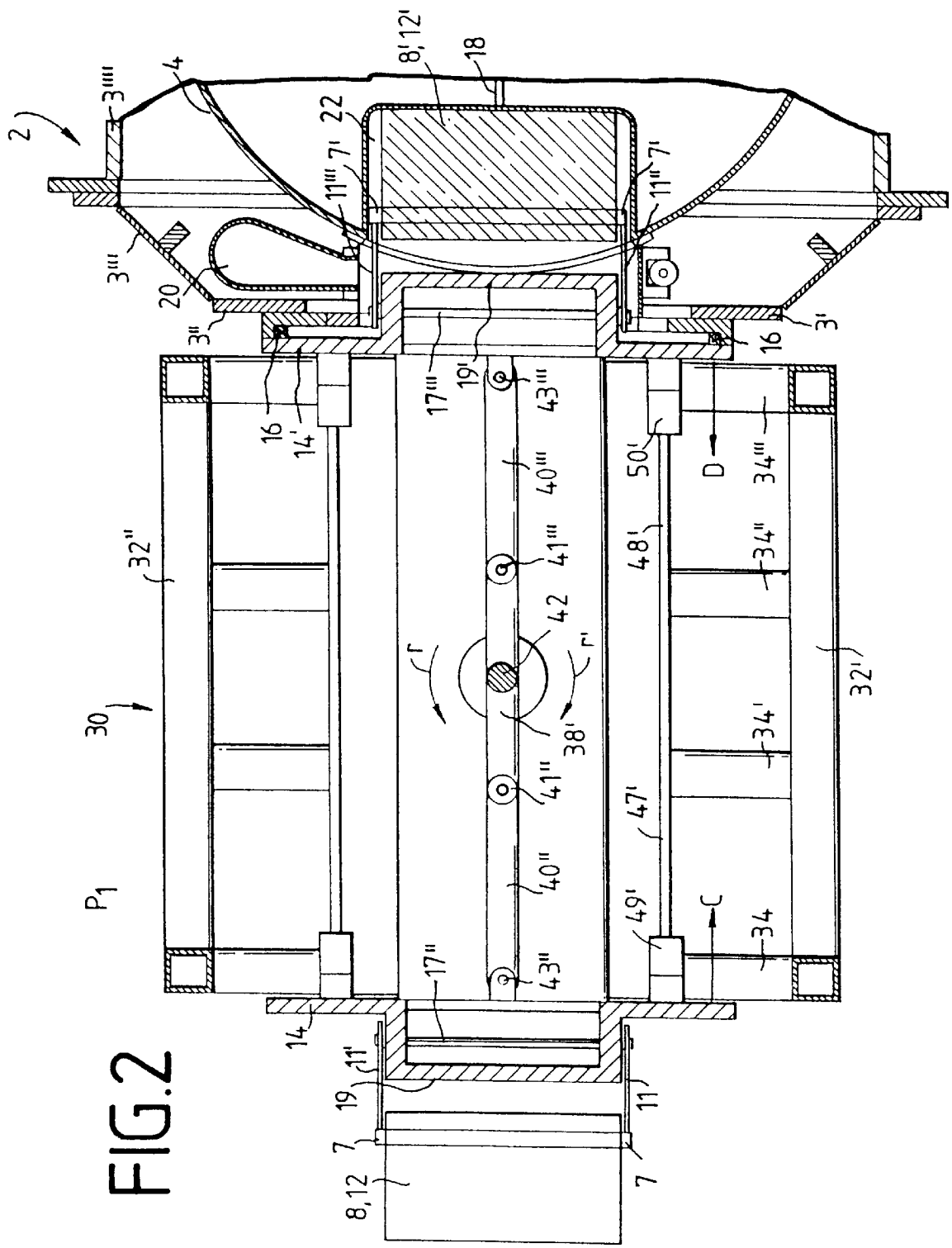
FIG. 2 is a schematic horizontal cross-sectional view through a loading/unloading device with a two-arm lever mechanism in the closed position.
Figure 3:
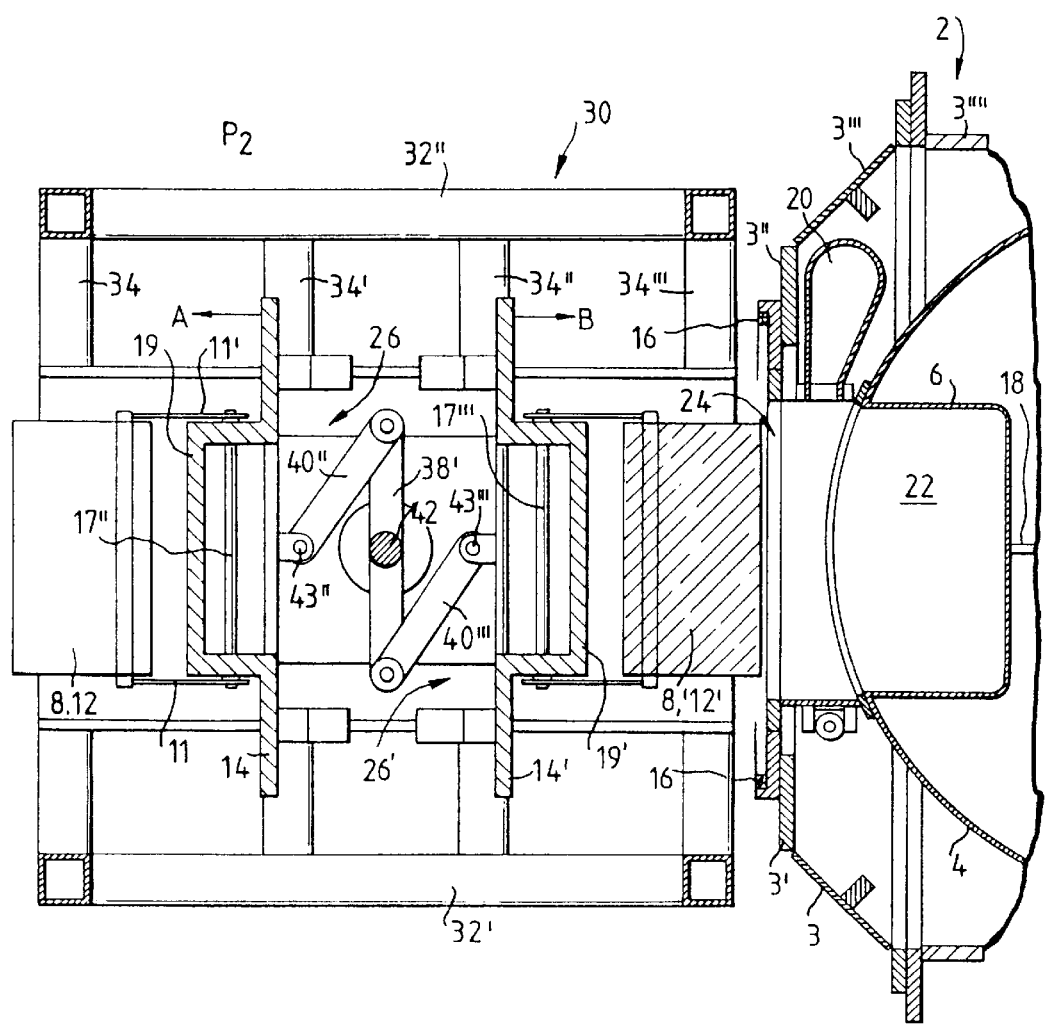
FIG. 3 is a schematic cross-sectional view as per FIG. 2 in the open position of the loading/unloading device.
Figure 4:
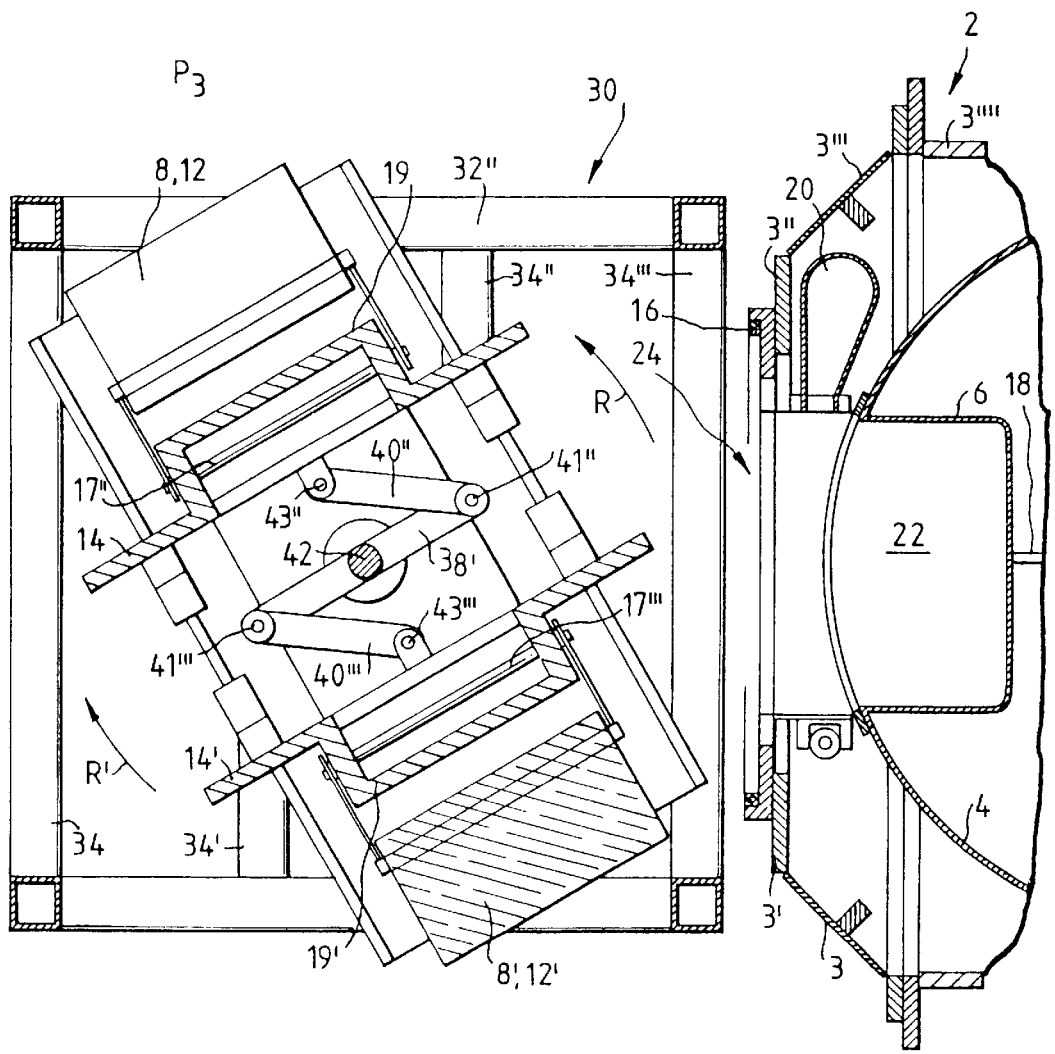
FIG. 4 is a schematic cross-sectional view of a loading/unloading device with two pusher parts which can be swung around a vertical axle.

The present invention will now be described in greater detail and as illustrated by the embodiments depicted in the drawings.

According to the invention, a loading/unloading device essentially consists of at least one pivot-mounted pusher part, which can be radially moved around a non-spinning axle to a pre-selected rotational position in relation to the turning axle between an open and closed position as desired. The cover closing off the in/out transport station is situated on the pusher part. For the reception and transport of the workpiece to be transported, the cover has a retaining device holding the workpieces to be processed, primarily to be coated. Through the design of the pusher part and cover part as well as the retaining device transporting the workpieces, the pusher part possesses a double function that advantageously shortens the time required for the loading and unloading of the vacuum chamber and with which it first advantageously makes possible the automatic loading/unloading with a short term coating apparatus.

A further advantage is attained according to the invention with the device herein below. According to this, at least 2 pusher parts are provided which are primarily diametrically arranged opposite one another with respect to the turning axle. This has the advantage, that the loading of the transport station by the first pusher part can take place parallel to the loading of the retaining device of the second pusher part with workpieces to be treated in the vacuum chamber. For unloading, or the next loading, of the transport station, the second pusher part, primarily firmly joined to the first pusher part, is then turned in synchronization with it about the axle in front of the open transport station door, and the uncoated workpieces are brought into the transport station, whereby the vacuum chamber is simultaneously closed such that it can be evacuated. Through the use of several preferably synchronously activated pusher pieces, several movement runs occur parallel to one another in terms of time, through which a further reduction of the cycle time of the coating process is attained. A further advantage in this is that the manual loading of the coating apparatus without increasing the cycle time is possible, since the workpiece carriers are no longer loaded in the transport station, but rather, outside at the loading/unloading device.

A further advantage thereby results, that the cover built onto the pusher part has a displacement body, which together with the workpieces to be coated can be brought into the in/out transport station, with which the total volume of the vacuum chamber to be evacuated is reduced. In this way, pump out time required to attain the working vacuum is reduced, whereby a further reduction of the cycle time is effected.

In FIG. 1 there is depicted a loading/unloading device 30 of a vacuum chamber 2 arranged with workpieces to be coated. The vacuum chamber 2 has several chambers, specifically, for example a handling station, a transport station and so-called substrate chambers, of which, however, only the in/out transport station is depicted in FIGS. 2 through 5. For the sending of the transport station 22 with workpieces 8,8' to be coated in the vacuum chamber 2, the loading/unloading device 30 is arranged opposite the opening 24 set in the vacuum chamber wall 3,3',3",3'" and outer wall 3"".

The loading/unloading device 30 includes a rack 32,32', 32", which, in its surface dimensions, is delimited by rack legs 33,33' arranged at right angles to one another, which in turn rest on rollers 35,35'. With the rollers 35,35', the loading/unloading device can be transported in front of the vacuum chamber 2, in order, for example, to make possible access for maintenance works on the vacuum chamber 2. During the loading/unloading processes, the rack 32,32',32", with loading/unloading device 30 integrated into it, is fixed in position in front of the vacuum chamber 2.

The loading/unloading device 30 includes two pusher parts 26,26' arranged 180° from each other, symmetric with respect to a vertical axle 42, which are mobile mounted with sliding elements 49,50 engaged in an upper guide rail 47,48 and sliding elements 49'50' engaged in lower guide rails 47', 48' in the rack 32,32',32"; 34,34' 34" 34'". An arm 38, as a part of the lever mechanism 23, which is swing mounted on both its ends by a joint 41,41' for each with a push/pull connecting rod 40,40', is firmly attached to the drive axle 42 actuated by a motor 45, whereby the push/pull connecting rods 40/40', are each linked with a linkage body 43,43' to the pusher parts 26,26' arranged opposite one another in mirror image symmetry with respect to the axle 42. Push/pull rods 40", 40'" and joints 41", 41'" as well as joints 43", 43'" are similarly arranged in the apparatus. The pusher parts 26,26' are formed as covers for the closure of the opening 24. For this, the covers 14,14' each have sealing surfaces on the sides facing the vacuum chamber 2 in the closed position $P_1$, (see FIG. 2) which, in conjunction with sealing elements 16 arranged laterally to the opening 24, seal off the vacuum chamber 2 so that it can be evacuated. Gripping arms, 10',11' or 10",11", are arranged in pairs (see FIG. 3) on the covers 14,14'. The gripping arms, 10',11' or 10",11", present in pairs, are each attached at the ends by connecting rods 17,17' to the cover 14, 14" through projecting part 19,19' of the cover 14, 14' in which they are situated, whereby the gripping arms 10' and 11' or 10" and 11" are each swing mounted to each other by the connecting rod 17 or 17'. Retaining elements 7,17' are similarly arranged.

For the unloading of, for example, the workpieces to be coated in the vacuum chamber 2, the in/out transport station 22 is driven into its removal position, as depicted in FIGS. 2 through 5, through turning of the inner cylinder 4 by rotation of the driven arm 18 by a shaft not depicted in the drawings. Substrate chamber 6 is attached to inner cylinder 4. Through actuation of the connecting rod 17, 17', 17", the gripping arms 10,11 are swung up and engage the carrying bases 12 on lateral retaining elements 7,7' provided on them for this. During this transfer of the carrying base 12 to the gripping arms 10,11, the in/out transport station 22 is aerated simultaneously at atmospheric pressure through inlet of a gas through a gas intake not depicted in the drawing. After the pressure equalization in the in/out transport station 22 has been accomplished, the push/pull connecting rod 40,40' is swung in the joint 41,41' by rotation of the shaft 42 driven by the drive device 45 (see FIG. 1) in the rotational direction r', whereby the pusher parts 26 and 26' are moved in synchronized movement through the joint 43 or 43' on the drive shaft. In this way the cover 14 of the exterior vacuum chamber wall 3',3" is lifted off and removed from the in/out transport station 22 together with the coated workpieces 8' situated on the carrying base 12.

In the drawings A, B, C and D indicate push directions. R and R' represent the turning direction of the pusher part 26, 26' and r, r' indicate the training direction of the shaft 42. $P_3$ represents the change position.

For the removal of the coated workpieces 8 from the carrying base 12, the pusher pieces 26,26', together with the double arm lever mechanism 23 are swung 180° around the drive shaft 42 in the rotational direction R'. The transport station 30 is next conveyed by actuation of the lever mechanism 23, whereby the drive shaft 42 is rotated 180° in rotational direction r (see FIG. 2) from the open position $P_2$ into the closed position $P_1$ depicted in FIG. 2. Alternatively, a continued 180° rotation in rotational direction r' is also possible. In this way the carrying base 12', bearing the substrates 8' to be coated and held by the gripping arms 10'11', is positioned in front of the opening 24, conveyed into the in/out transport station 22 through actuation of the lever mechanism 23, and the opening 24 is closed vacuum tight with the transport cover 14' and by the sealing devices 16 set into the vacuum chamber wall 3',3".

Figure 5:
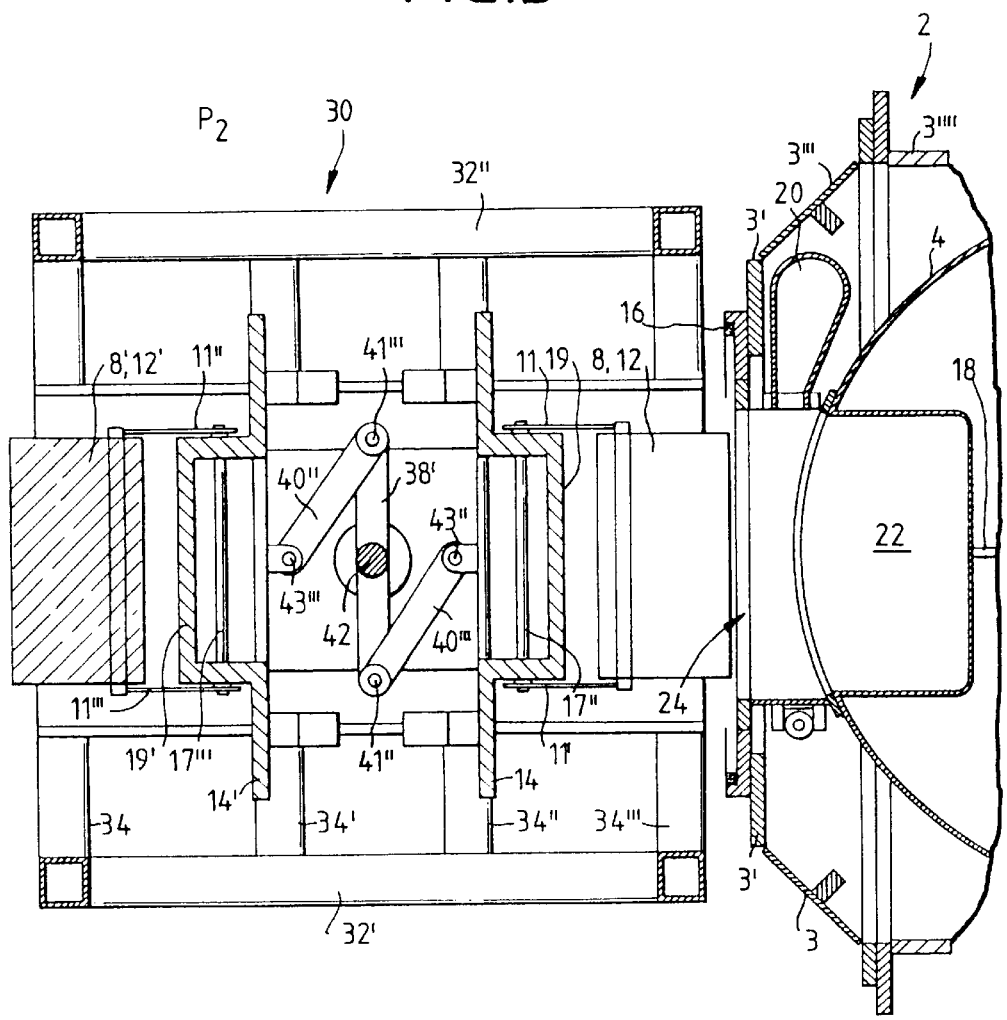
FIG. 5 is a schematic cross-sectional view of the loading/unloading device depicted in FIG. 4 after 180° swinging of the pusher parts about the vertical axle.

Next, the carrying base 12' is transferred by swinging of the gripping arm 10',11' to the in/out transport station 22 for further transport by rotation of the inner cylinder 4 (see FIG. 5). Parallel to the transfer process, the vacuum chamber 2 is evacuated to its final working pressure by means of a pump device not depicted in the drawings through the air intake 20 (see FIGS. 2 through 5).

The previously coated substrates 8 now outside of the vacuum chamber can henceforth be removed together with their carrying bases 12 or, in terms of substrate from the carrying base 12, for example by robotic handling. The pusher part 26' now found in the closed position $P_1$ thereafter remains available for reloading with substrates to be coated.

Further variations and modifications will be apparent to those skilled in the art from the foregoing and are intended to be encompassed by the claims appended hereto.

German priority application 197 15 151.5 is relied on and incorporated herein by reference.

We claim:

1. A device for the loading and unloading of a vacuum chamber with workpieces to be processed at a processing station in the vacuum chamber, comprising:

an in/out transport station of the vacuum chamber for receiving a workpiece from atmospheric pressure or transporting a workpiece to atmospheric pressure through at least one opening set into a wall of the vacuum chamber wherein a cover and sealing devices are provided for vacuum tight closing of the opening, at least one pusher part which can be rotated about a turning axle which is in a fixed position in relation to the opening, which pusher part has a lever mechanism which is a push/pull connecting rod, linked on one end to said cover and on the other end to an arm affixed to said turning axle, which pusher part is radially movable in relation to the axle and whereby, at least one gripping device is arranged on the pusher part on the cover, for the reception and for the transport of the workpiece, and whereby, through rotation of the axle, the push/pull connecting rod with its ends linked to the cover, is radially movable in relation to the axle between an open position of the cover, whereby a workpiece is near the axle in relation to the opening and a closed position, whereby a workpiece is distant from the axle in relation to the opening, whereby the gripping device is arranged on the cover, such that is completely projects into the vacuum chamber in the closed position.

2. The device according to claim 1, wherein at least two pusher parts, primarily diametrically opposed in relation to the axle, are provided, wherein each has a cover, and wherein the pusher parts are radially movable in relation to the axle, whereby the pusher parts can be rotated in at least one turning direction about the axle.

3. The device according to claim 2 wherein said pusher parts are radially movable in a joined opposing movement.

4. The device according to claim 1 wherein the vacuum chamber has an in/out transport station and wherein the cover has a displacement body, which projects into the in/out transport station with the closure of opening by the cover, such that the vacuum chamber's volume which can be evacuated is reduced.

5. The device according to claim 2 wherein the vacuum chamber has an in/out transport station and wherein the cover has a displacement body, which projects into the in/out transport station with the closure of opening by the cover, such that the vacuum chamber's volume which can be evacuated is reduced.

6. A process for the loading and unloading of a vacuum chamber with workpieces to be processed at a processing station in the vacuum chamber, including an in/out transport chamber of the vacuum chamber for receiving a workpiece from atmospheric pressure or transporting a workpiece to atmospheric pressure, through at least one opening provided in a chamber wall of the vacuum chamber, wherein a cover and sealing devices are provided for a vacuum type closing of the opening, and whereby the following process steps are carried out:

a. loading a carrying base arranged on a pusher part of the loading/unloading device with the workpiece to be processed;

b. rotating the loaded pusher part about an axle which is in a fixed position in relation to the vacuum chamber in front of the opening;

c. feeding a workpiece carrier into the vacuum chamber through advancement of the pusher part along a direction of movement which is radial in relation to the axle, whereby the opening is closed off with a cover connected to the pusher part.

7. A process for the unloading of a vacuum chamber filled with processed workpieces, whereby the workpieces are brought out of the vacuum chamber through at least one opening set into a chamber wall of the vacuum chamber that can be closed off with a cover, whereby the following process steps are provided:

a) aerating the vacuum chamber through the intake of a gas;

b) extracting a workpiece carrier loaded with workpieces by radial movement of a pusher part along a direction of movement in relation to an axle moving away from the vacuum chamber; and c) rotating the pusher part about the axle in a removal position for the mechanical and/or manual unloading of the processed workpieces.

8. The process according to claim 6, wherein the evacuation of the vacuum chamber is begun while the workpiece carrier is transferred to a gripping arm provided in the vacuum chamber.

9. The process according to claim 7, wherein the vacuum chamber is aerated, while the workpiece carrier to be removed from the vacuum chamber is taken over by the gripping arm arranged on the pusher part.

* * * * *